US007015136B2

(12) United States Patent
Bao et al.

(10) Patent No.: US 7,015,136 B2
(45) Date of Patent: Mar. 21, 2006

(54) METHOD FOR PREVENTING FORMATION OF PHOTORESIST SCUM

(75) Inventors: Tien-I Bao, Hsinchu (TW); Shwang-Min Jeng, Hsinchu (TW); Syun-Ming Jang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/618,219

(22) Filed: Jul. 10, 2003

(65) Prior Publication Data

US 2005/0006340 A1 Jan. 13, 2005

(51) Int. Cl.
*H01L 21/302* (2006.01)

(52) U.S. Cl. .......................... 438/638; 430/5; 438/687; 438/705; 438/717; 438/725; 438/736; 438/950

(58) Field of Classification Search ................ 438/705, 438/714, 717, 725, 734, 736, 740, 750, 687, 438/950, 638; 430/5
See application file for complete search history.

(56) References Cited

U.S. PATENT DOCUMENTS 5,728,456 A * 3/1998 Adair et al. ................ 428/216
6,103,456 A * 8/2000 Tobben et al. .............. 430/317
6,569,777 B1 * 5/2003 Hsu et al. ................... 438/725
6,689,695 B1 * 2/2004 Lui et al. .................... 438/700
6,713,386 B1 * 3/2004 Hu et al. .................... 438/639
6,720,251 B1 * 4/2004 van Schravendijk et al. .......................... 438/636
2003/0207207 A1 * 11/2003 Li .......................... 430/272.1
2004/0084680 A1 * 5/2004 Ruelke et al. ................ 257/77
2004/0087139 A1 * 5/2004 Yeh et al. ................... 438/636
2004/0087164 A1 * 5/2004 Bao et al. ................... 438/694

* cited by examiner

*Primary Examiner*—George A. Goudreau
(74) *Attorney, Agent, or Firm*—Thomas, Kayden, Horstemeyer & Risley

(57) ABSTRACT

A method for preventing formation of photoresist scum. First, a substrate on which a dielectric layer is formed is provided. Next, a non-nitrogen anti-reflective layer is formed on the dielectric layer. Finally, a photoresist pattern layer is formed on the non-nitrogen anti-reflective layer. During the formation of the photoresist pattern layer, the non-nitrogen anti-reflective layer does not react with the photoresist pattern layer, thus not forming photoresist scum. This prevents undesired etching profile and critical dimension (CD) change due to presence of photoresist scum. The non-nitrogen anti-reflective layer can be silicon-rich oxide ($SiO_x$) or hydrocarbon-containing silicon-rich oxide ($SiO_xC_y$:H).

43 Claims, 9 Drawing Sheets

METHOD FOR PREVENTING FORMATION OF PHOTORESIST SCUM

BACKGROUND OF THE INVENTION

1. Field of the Invention

The invention relates to a semiconductor process, and more particularly to a method for preventing formation of photoresist scum in order to improve etching profile and prevent clogging of via holes, thus improving subsequent metallization.

2. Description of the Related Art

In current semiconductor integrated circuit method, the photolithography technique is a very critical procedure, in which accurate transfer of the circuit design to the semiconductor substrate determines the product properties. Generally, photolithography technique includes coating, exposure, development, and photoresist stripping. In recent years, with continuous miniaturization in device size, photolithography techniques require improvement and play an even more critical role in device quality, yield, and cost.

In the dual damascene photolithography method, nitrogen (N) reacts with and contaminates the photoresist. Thus, during the development procedure, amine ($NH_x$) photoresist scum remains, in turn forming an inaccurate pattern and seriously affecting the electrical properties of the device. The nitrogen source is derived from silicon oxynitride (SiON) material of the anti-reflective layer (ARL) and the silicon nitride or silicon carbon nitride (SiCN) material of the etching stop layer. In order to further understand the background of the present invention, the conventional method for forming a dual damascene structure is explained accompanied by FIGS. 1*a* to 1*e*.

First, in FIG. 1*a*, an etching stop layer 102 such as silicon nitride or silicon carbon nitride, a dielectric layer 104, an anti-reflective layer 106 such as silicon oxynitride, and a photoresist layer 108 are formed in sequence on a substrate 100.

Subsequently, in FIG. 1*b*, a photoresist pattern layer 108*a* is formed using exposure and wet development. Since the photoresist layer 108 is contaminated by nitrogen, the photochemical reaction is not complete during exposure. Thus, during wet development, photoresist scum 108*b* remains on the sidewalls of the photoresist pattern layer 108*a*. Therefore, when etching is performed to form a via hole 104*a*, the etching profile is inferior and the critical dimension (CD) is changed as shown in FIG. 1*c*, seriously effecting the electrical properties of the device.

Subsequently, in FIG. 1*d*, after the photoresist pattern layer 108*a* is removed, a photoresist layer 110 is formed on the anti-reflective layer 106 and in the via hole 104*a*.

Finally, in FIG. 1*e*, a photoresist pattern layer 110*a* is formed on the anti-reflective layer 106 by exposure and development. Next, etching is performed to form a trench 104*b* over the via hole 104*a*, making up a dual damascene structure. In the same way, due to nitrogen contamination during the exposure and development methods, photoresist scum 110*b* clogs the via hole 104*a*. Photoresist scum 110*b*, detrimental to subsequent metallization and causing device failure, and is very difficult to remove even by photoresist stripping.

In order to solve the above-mentioned problem, plasma descumming with oxygen plasma is performed on photoresist pattern layers suffering formation of photoresist scum. However, after plasma descumming, the photoresist pattern layer thins and has decreased etching resistance. Also, the resulting pattern will be larger than the original design, which in turn changes the electrical properties of the device and does not meet the original device requirements.

In addition, some researchers have developed special photoresists or developers to prevent formation of photoresist scum. Although the photoresist scum problem is solved, the production cost increases.

SUMMARY OF THE INVENTION

Accordingly, an object of the present invention is to provide a method for preventing formation of photoresist scum by means of using a non-nitrogen material as the anti-reflective layer to prevent nitrogen from contaminating the photoresist.

Another object of the present invention is to provide a method of preventing formation of photoresist scum by sandwiching the anti-reflective layer with two barrier layers and forming a barrier layer on the etching stop layer in order to prevent nitrogen from diffusing into the dielectric layer.

According to the object of the invention, a method for preventing formation of photoresist scum includes the following steps. A substrate on which a dielectric layer is formed is provided. Next, a non-nitrogen anti-reflective layer is formed on the dielectric layer. Finally, a photoresist pattern layer is formed on the non-nitrogen anti-reflective layer. During the formation of the photoresist pattern layer, the non-nitrogen anti-reflective layer does not react with the photoresist pattern layer, thus not forming photoresist scum. The non-nitrogen anti-reflective layer can be silicon-rich oxide ($SiO_x$) or hydrocarbon-containing silicon-rich oxide ($SiO_xC_y$:H), where $x<2$.

The present invention also provides a method of preventing formation of photoresist scum suitable for a dual damascene process and the method of preventing formation of photoresist scum includes the following steps. A substrate on which an etching stop layer, a dielectric layer, a first barrier layer, and an anti-reflective layer are formed is provided. The first barrier layer blocks a first dopant in the anti-reflective layer from diffusing into the dielectric layer. Next, the anti-reflective layer, the first barrier layer, and the dielectric layer are etched to form a via hole. Next, a photoresist pattern layer is formed on the anti-reflective layer and a protective plug is filled in the via hole. The first barrier layer blocks the first dopant in order to prevent photoresist scum forming in the via hole. Finally, the anti-reflective layer, the first barrier layer, and the dielectric layer are etched using the photoresist pattern layer and the protective plug as a mask to form a trench above the via hole, thus forming a dual damascene structure. The method can further include forming a second barrier layer between the etching stop layer and the dielectric layer in order to block a second dopant in the etching stop layer from diffusing into the dielectric layer. Moreover, the method can further include forming a third barrier on the anti-reflective layer. The first, second, and third barrier layers can be silicon-rich oxide ($SiO_x$) or hydrocarbon-containing silicon oxide ($SiO_xC_y$:H), where $x<2$, and have a thickness of 50 to 1000 A. The first and second dopants can be nitrogen.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 2*a* to 2*e* are cross-sections illustrating the method flow of preventing formation of photoresist scum according to a first embodiment of the present invention.

Figure 1A:
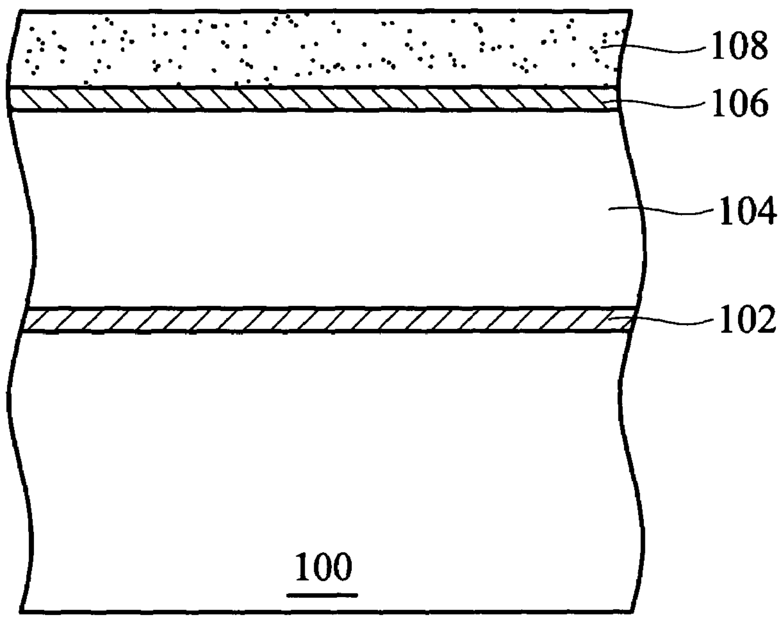
FIGS. 1*a* to 1*e* are cross-sections illustrating the conventional method flow of forming a dual damascene structure.
Figure 1B:
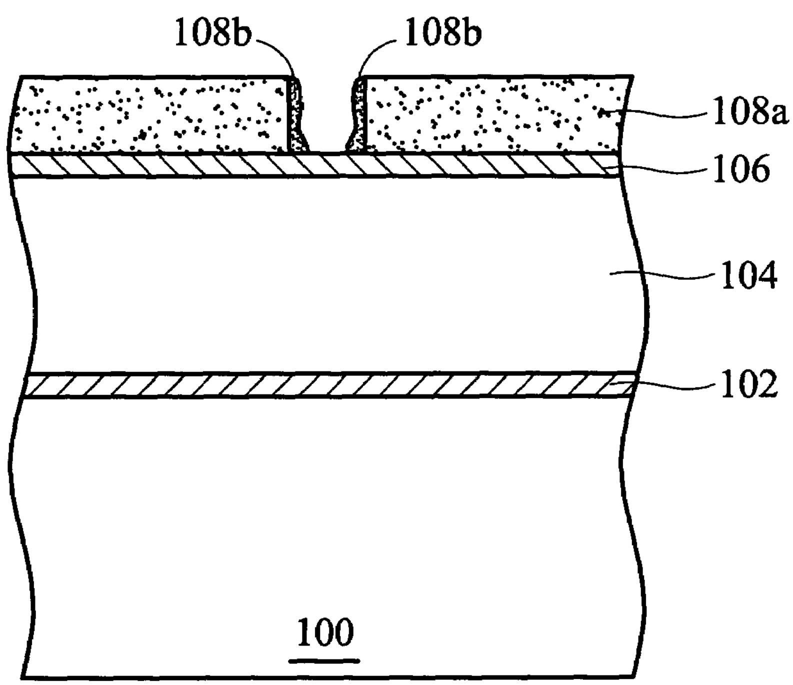
Figure 1C:
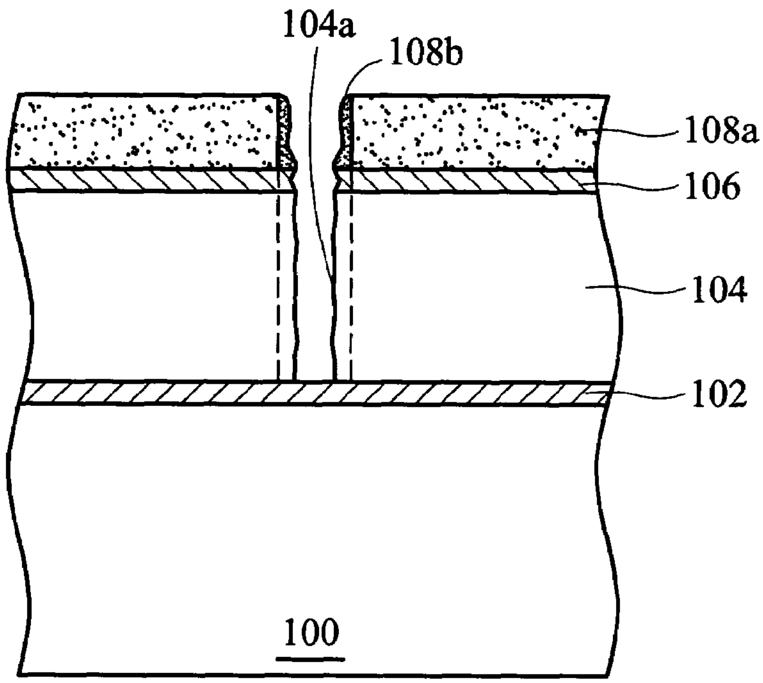
Figure 1D:
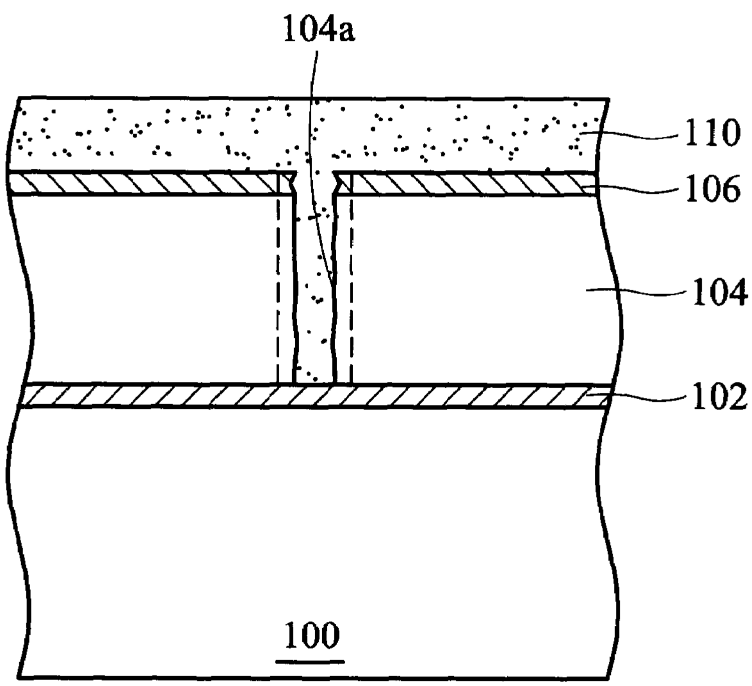
Figure 1E:
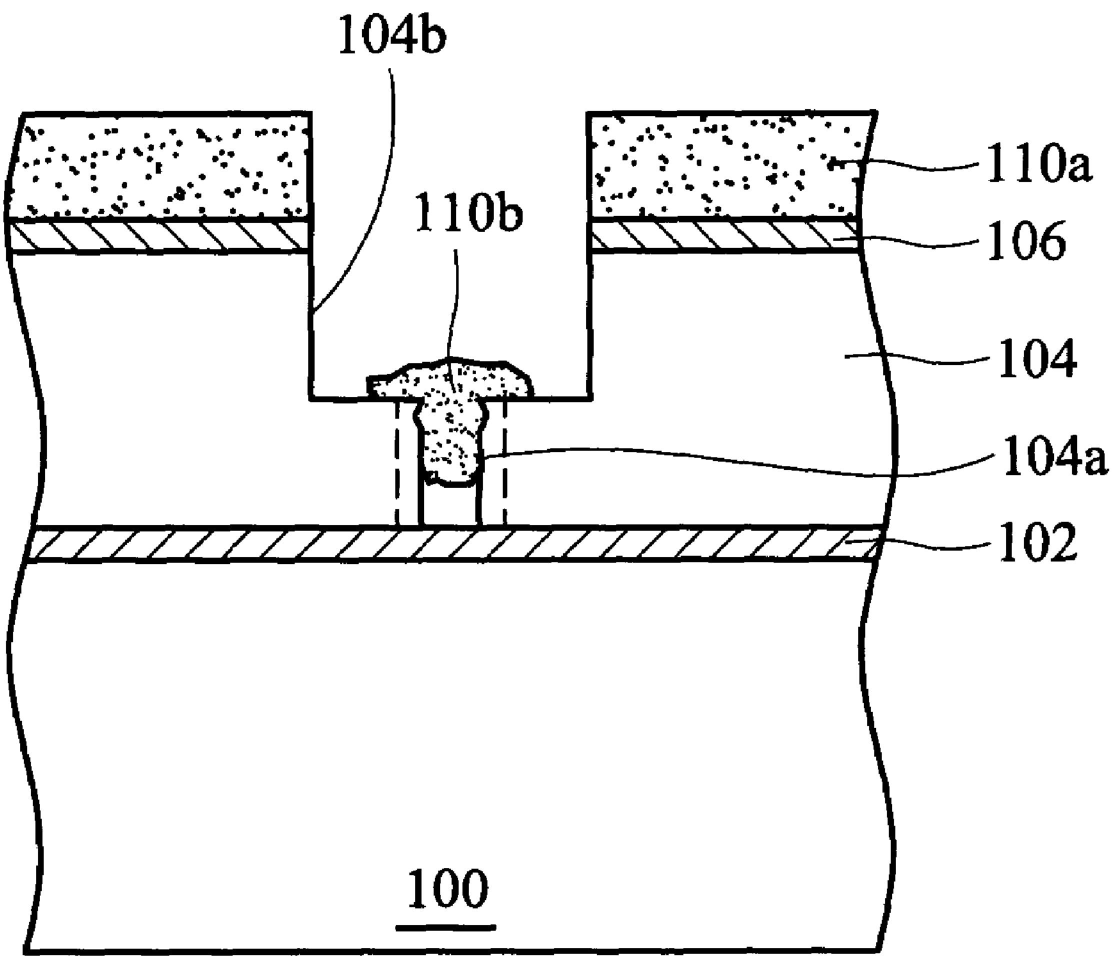
Figure 2A:
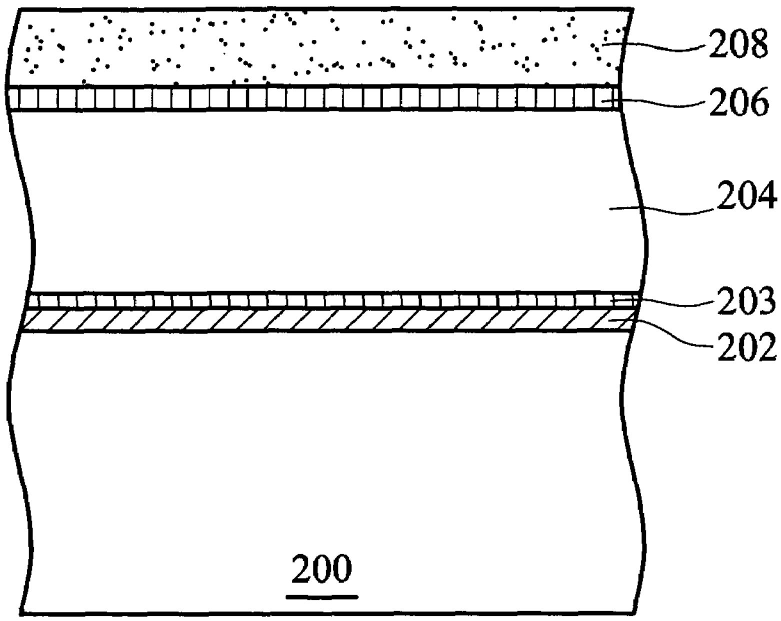
FIGS. 2*a* to 2*e* are cross-sections illustrating the method flow of forming a dual damascene structure according to a first embodiment of the present invention.

First, in FIG. 2*a*, a substrate 200 such as a silicon wafer is provided. Although there are semiconductor devices formed on the substrate 200, a flat substrate is depicted for simplicity. Next, an etching stop layer 202, a barrier layer 203, and a dielectric layer 204 are successively formed on the substrate 200. The material of the etching stop layer 202 can constitute silicon nitride or silicon carbon nitride. The barrier layer 203 can comprise silicon-rich oxide ($SiO_x$) or hydrocarbon-containing silicon-rich oxide ($SiO_xC_y$:H), where x<2, having a thickness of 50 to 1000 Å to block the dopant such as nitrogen in the etching stop layer 202 from diffusing into the dielectric layer 204. In addition, in the present embodiment, the etching stop layer 202 can also use material containing no nitrogen, such as silicon-rich oxide ($SiO_x$) or hydrocarbon-containing silicon-rich oxide ($SiO_xC_y$:H) where x<2. In this way, there is no need to form the above-mentioned barrier layer 203. Next, a non-nitrogen anti-reflective layer 206 and a photoresist layer 208 are formed on the dielectric layer 204. The non-nitrogen anti-reflective layer 206 can be silicon-rich oxide ($SiO_x$) or hydrocarbon-containing silicon-rich oxide ($SiO_xC_y$:H), where x<2.

Figure 2B:
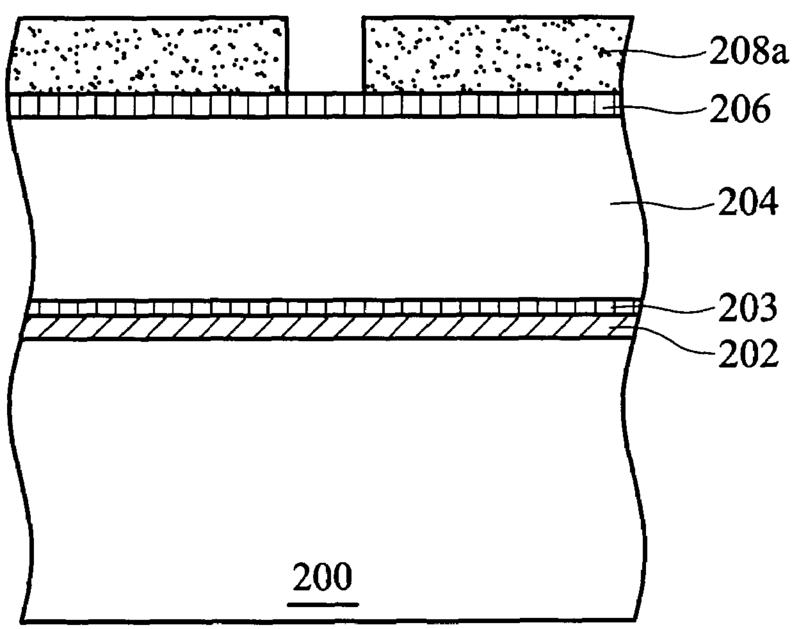

Subsequently, in FIG. 2*b*, a photoresist pattern layer 208*a* is formed using conventional exposure and wet development procedures. Since the non-nitrogen anti-reflective layer 206 contains no nitrogen, the photoresist layer 208 does not react with nitrogen during the photolithography method. That is, during wet development, no photoresist scum remains on the sidewalls of the photoresist pattern layer 208*a*.

Figure 2C:
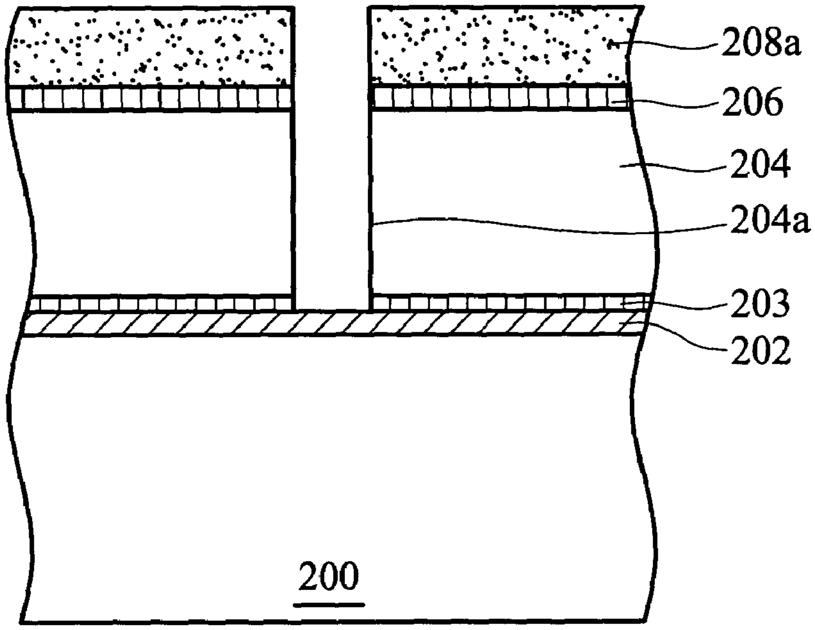

Subsequently, in FIG. 2*c*, the non-nitrogen anti-reflective layer 206, the dielectric layer 204, and the barrier layer 203 are etched in sequence using the photoresist pattern layer 208*a* as an etching mask, thus exposing the etching stop layer 202 surface and forming a via hole 204*a*. Since there is no photoresist scum, the via hole 204*a* has a better profile. In addition, since no plasma descumming is required, the critical dimension (CD) does not change.

Figure 2D:
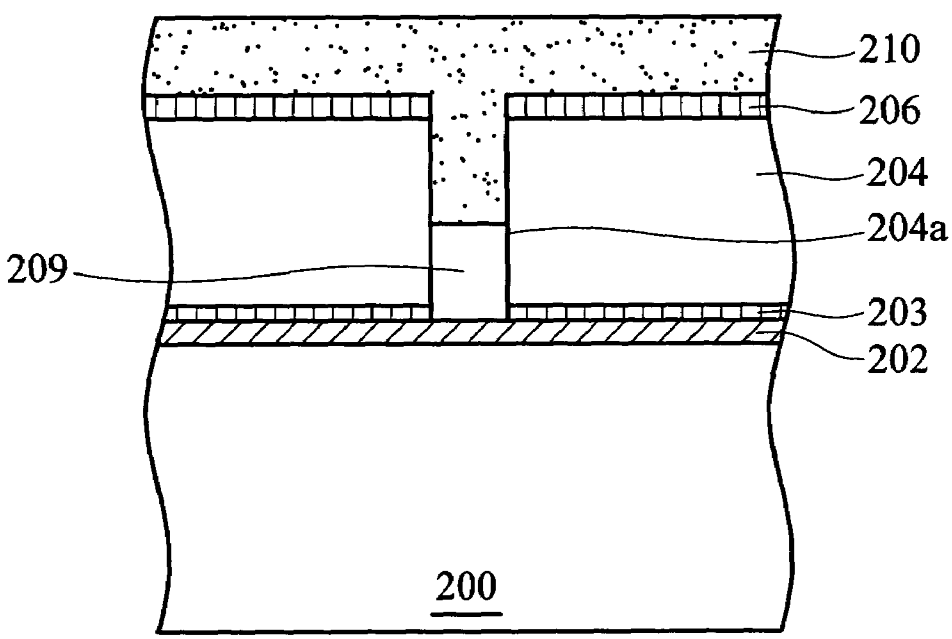

Next, in FIG. 2*d*, the photoresist pattern layer 208*a* is removed to expose the surface of the non-nitrogen anti-reflective layer 206. Next, a protective plug 209 is filled in the via hole 204*a*, such as i-line photoresist, to prevent the etching stop layer 202 from overetching, exposing the substrate 200. Next, a photoresist layer 210 is formed on the non-nitrogen anti-reflective layer 206 and on the protective plug 209 in the via hole 204*a*.

Figure 2E:
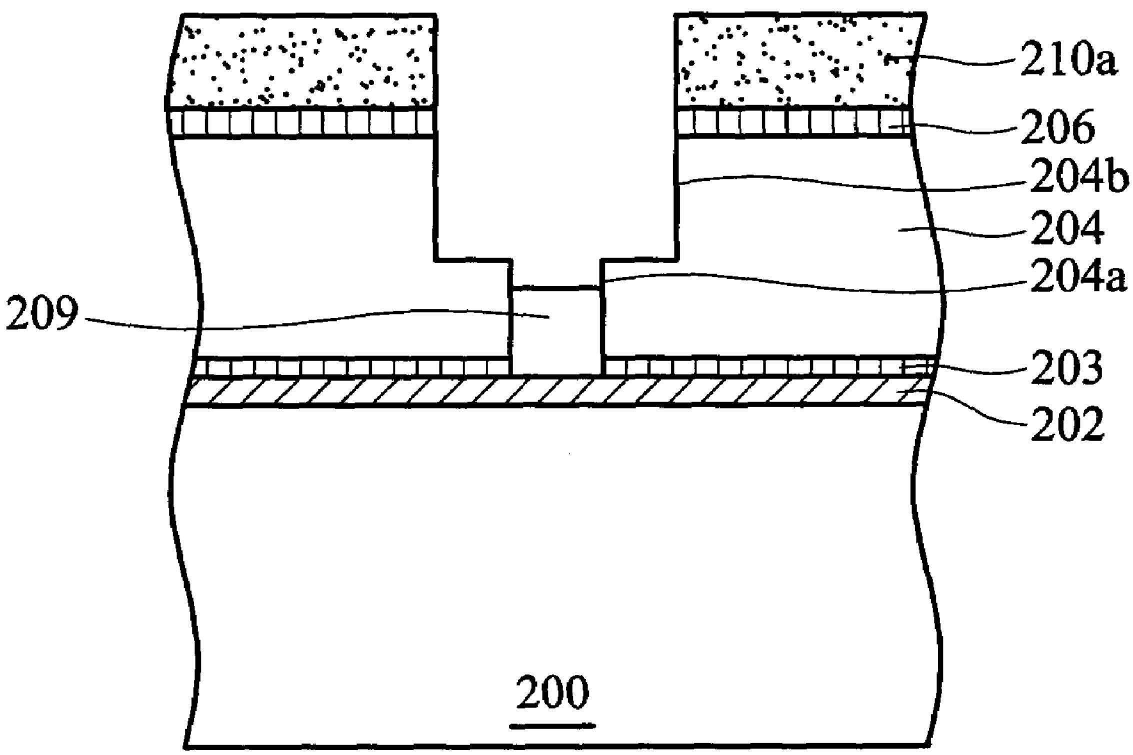

Finally, in FIG. 2*e*, a photoresist pattern layer 210*a* is formed using the exposure and development procedures. In the same way, the photoresist pattern layer 210*a* does not react with the non-nitrogen anti-reflective layer 206 to form residual scum. On the other side, although the etching stop layer 202 contains nitrogen, nitrogen cannot diffuse into the dielectric layer 204 because it is blocked by the barrier layer 203. Thus, the photoresist layer 210 in the via hole 204*a* will not be contaminated, and no photoresist scum forms in the via hole 204*a*. Next, the non-nitrogen anti-reflective layer 206 and the dielectric layer 204 are successively etched using the photoresist pattern layer 210*a* and the protective plug 209 as a mask to form a trench 204*b* above the via hole 204*a*, making up a dual damascene structure.

FIGS. 3*a* to 3*e* are cross-sections illustrating the method flow of preventing formation of photoresist scum according to a second embodiment of the present invention.

Figure 3A:
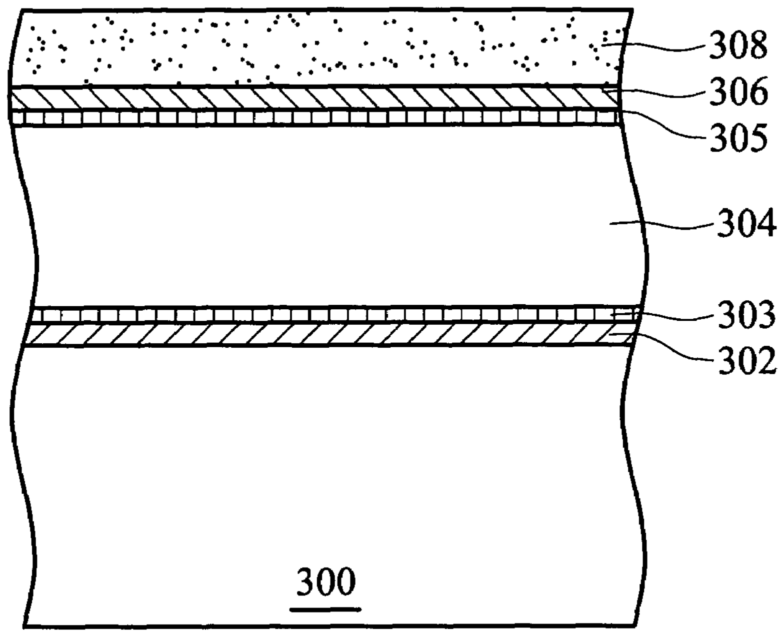
FIGS. 3*a* to 3*e* are cross-sections illustrating the method flow of forming a dual damascene structure according to a second embodiment of the present invention.

First, in FIG. 3*a*, a substrate 300, such as a silicon wafer is provided. Next, an etching stop layer 302, a barrier layer 303, a dielectric layer 304, a barrier layer 305, an anti-reflective layer 306, and a photoresist layer 308 are formed on the substrate 300 in sequence. The etching stop layer 302 can comprise silicon nitride or silicon carbon nitride. The anti-reflective layer 306 can be silicon oxynitride. The barrier layers 305 and 303 can comprise silicon-rich oxide ($SiO_x$) or hydrocarbon-containing silicon-rich oxide ($SiO_xC_y$:H), where x<2, having a thickness of 50 to 1000 Å to block the dopant, such as nitrogen, in the etching stop layer 302 and in the anti-reflective layer 306 from diffusing into the dielectric layer 304.

Figure 3B:
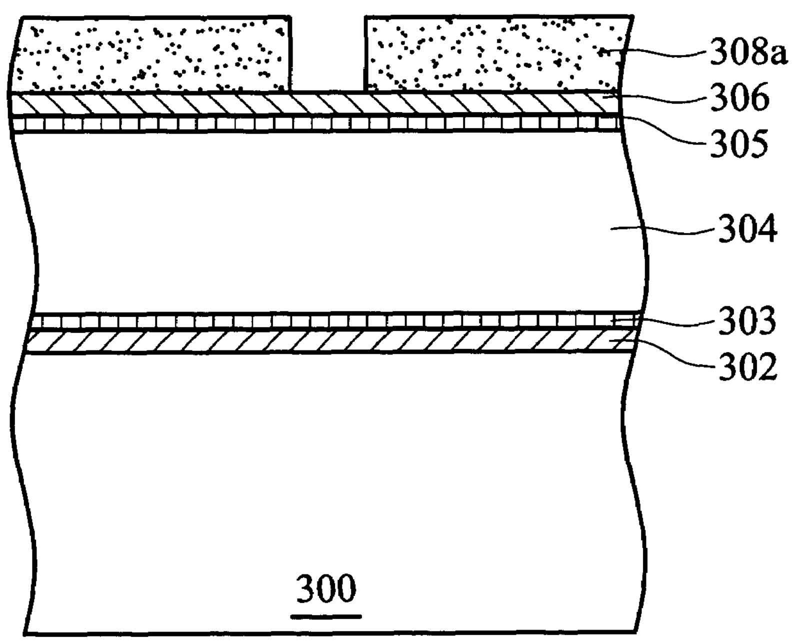
Figure 3C:
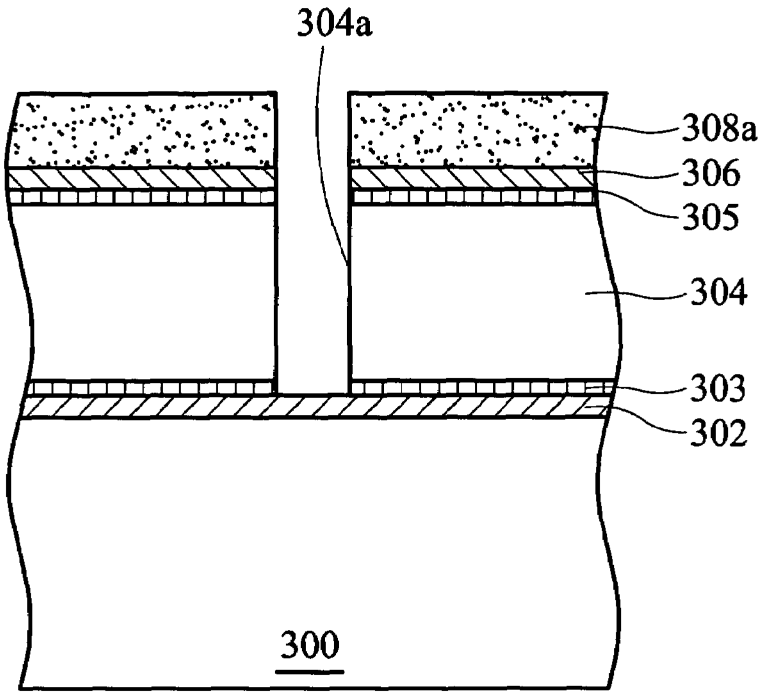

Subsequently, in FIG. 3*b*, a photoresist pattern layer 308*a* is formed using conventional exposure and wet development procedures. Next, in FIG. 3*c*, the anti-reflective layer 306, the barrier layer 305, the dielectric layer 304, and the barrier layer 303 are etched in sequence using the photoresist pattern layer 308*a* as an etching mask, thus exposing the surface of the etching stop layer 302 and forming the via hole 304*a*.

Figure 3D:
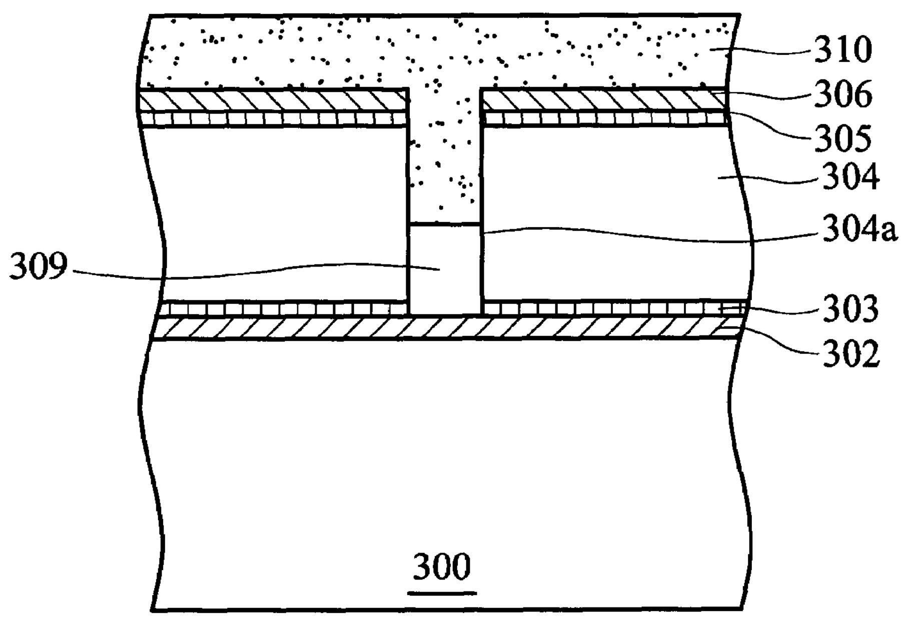

Subsequently, in FIG. 3*d*, the photoresist pattern layer 308*a* is removed to expose the surface of the anti-reflective layer 306. Next, a protective plug 309 is filled in the via hole 304*a*, such as i-line photoresist, to prevent the etching stop layer 302 from overetching, exposing the substrate 300. Next, a photoresist layer 310 is formed on the anti-reflective layer 306 and on the protective plug 309 in the via hole 304*a*.

Figure 3E:
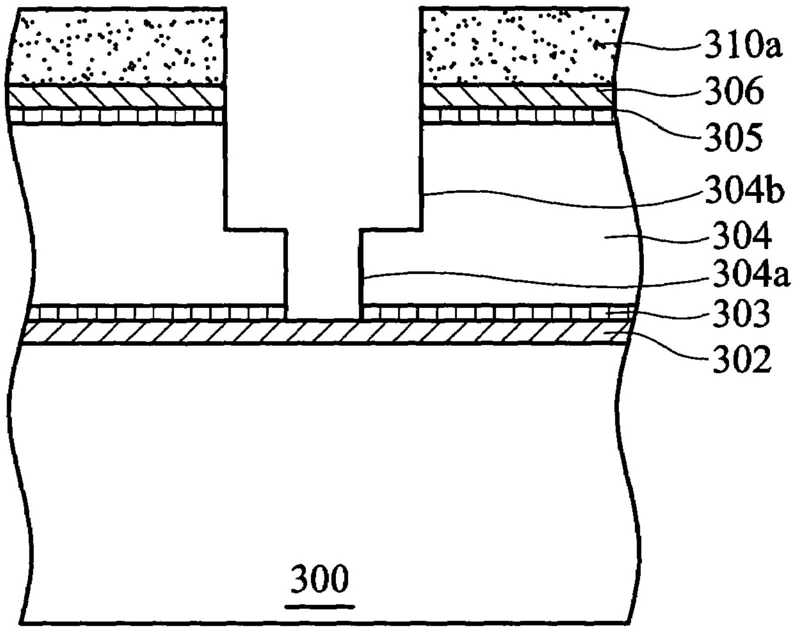

Finally, in FIG. 3*e*, a photoresist pattern layer 310*a* is formed using the exposure and development procedures. In the same way, during the photolithography method, although the anti-reflective layer 306 and the etching stop layer 302 contain nitrogen, nitrogen cannot diffuse into the dielectric layer 304 because of the blocking of the barrier layers 305 and 303 respectively. Thus, the photoresist layer 310 in the via hole 304*a* will not be contaminated, and there is no photoresist scum clogging of the via hole 304*a*, thus improving the subsequent metallization. Next, the non-nitrogen anti-reflective layer 306 and the dielectric layer 304 are successively etched using the photoresist pattern layer 310*a* and the protective plug 309 as a mask to form a trench 304*b* above the via hole 304*a*, making up a dual damascene structure.

Figure 4:
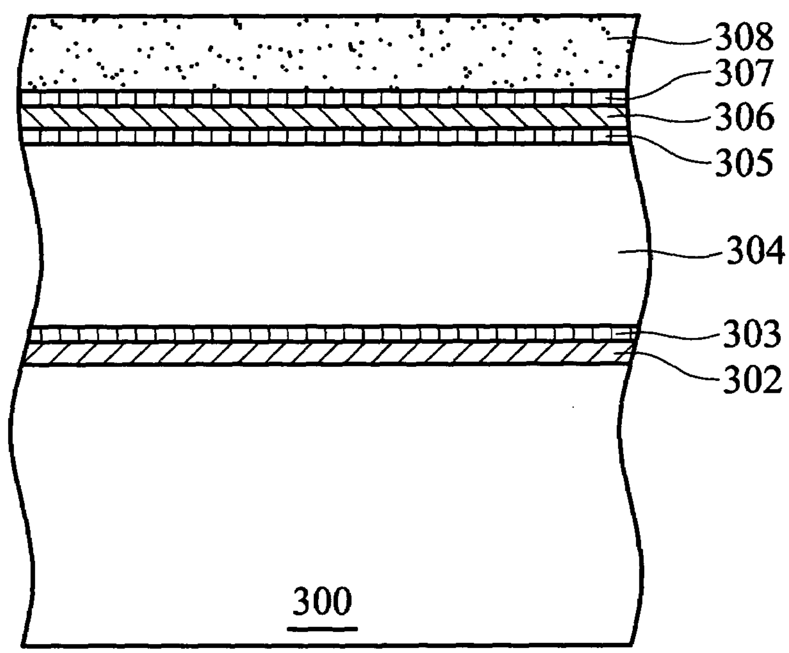
FIG. 4 is a cross-section illustrating another initial step of the method flow of forming a dual damascene structure according to a second embodiment of the present invention.

In addition, in FIG. 3*a*, it is noted that a barrier layer 307 can be optionally formed between the anti-reflective layer 306 and the photoresist layer 308, as shown in FIG. 4. The barrier layer 307 can comprise silicon-rich oxide ($SiO_x$) or hydrocarbon-containing silicon-rich oxide ($SiO_xC_y$:H), where x<2, having a thickness of 50 to 1000 Å to further block the dopant, such as nitrogen, in the anti-reflective layer 306 from diffusing into the dielectric layer 304.

According to the inventive method, photoresist scum is effectively prevented by the use of the non-nitrogen material as the anti-reflective layer, the etching stop layer, or the barrier layer. In addition, since no plasma descumming is required and no special photoresist or developer is used, the critical dimension does not change and the production cost is decreased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for preventing formation of photoresist scum, comprising the steps of:

providing a substrate on which a dielectric layer is formed;

forming a non-nitrogen anti-reflective layer on the dielectric layer; and forming a photoresist pattern layer on the non-nitrogen anti-reflective layer, wherein during the formation of the photoresist pattern layer, the non-nitrogen anti-reflective layer does not react with the photoresist pattern layer, thus not forming photoresist scum.

2. The method as claimed in claim 1, further comprising forming an etching stop layer containing no nitrogen between the substrate and the dielectric layer.

3. The method as claimed in claim 1, wherein the non-nitrogen anti-reflective layer is a silicon-rich oxide layer.

4. The method as claimed in claim 1, wherein the non-nitrogen anti-reflective layer is a hydrocarbon-containing silicon-rich oxide layer.

5. A method for preventing formation of photoresist scum, comprising the steps of:

providing a substrate on which a dielectric layer is formed;

forming a non-nitrogen anti-reflective layer on the dielectric layer;

forming a first photoresist pattern layer on the non-nitrogen anti-reflective layer, wherein during the formation of the first photoresist pattern layer, the non-nitrogen anti-reflective layer does not react with the first photoresist pattern layer, thus not forming photoresist scum;

etching the non-nitrogen anti-reflective layer and the dielectric layer using the first photoresist pattern layer as a mask to form a via hole;

removing the first photoresist pattern layer to expose the non-nitrogen anti-reflective layer surface; and forming a second photoresist pattern layer on the non-nitrogen anti-reflective layer, wherein during the formation of the second photoresist pattern layer, the non-nitrogen anti-reflective layer does not react with the second photoresist pattern layer, thus not forming photoresist scum.

6. The method as claimed in claim 5, further comprising forming an etching stop layer between the substrate and the dielectric layer.

7. The method as claimed in claim 6, further comprising forming a barrier layer between the etching stop layer and the dielectric layer to block a dopant in the etching stop layer from diffusing into the dielectric layer.

8. The method as claimed in claim 7, wherein the barrier layer is a silicon-rich oxide layer.

9. The method as claimed in claim 7, wherein the barrier layer is a hydrocarbon-containing silicon-rich oxide layer.

10. The method as claimed in claim 7, wherein the barrier layer has a thickness of 50 to 1000 A.

11. The method as claimed in claim 7, wherein the dopant is nitrogen.

12. The method as claimed in claim 5, wherein the non-nitrogen anti-reflective layer is a silicon-rich oxide layer.

13. The method as claimed in claim 5, wherein the non-nitrogen anti-reflective layer is a hydrocarbon-containing silicon-rich oxide layer.

14. A method of preventing formation photoresist scum for dual damascene process, comprising the steps of:

providing a substrate on which an etching stop layer, a dielectric layer, a first barrier layer, and an anti-reflective layer are formed;

etching the anti-reflective layer, the first barrier layer, and the dielectric layer to form a via hole therein;

forming a protective plug in the via hole;

forming a photoresist pattern layer on the anti-reflective layer, wherein the first barrier layer blocks a first dopant in the anti-reflective layer from diffusing into the dielectric layer in order to prevent forming photoresist scum in the via hole; and etching the anti-reflective layer, the first barrier layer and the dielectric layer using the photoresist pattern layer and the protective plug as a mask to form a trench above the via hole, thus forming a dual damascene structure.

15. The method as claimed in claim 14, wherein the first barrier layer is a silicon-rich oxide layer.

16. The method as claimed in claim 14, wherein the first barrier layer is a hydrocarbon-containing silicon-rich oxide layer.

17. The method as claimed in claim 14, wherein the first barrier layer has a thickness of 50 to 1000 A.

18. The method as claimed in claim 14, wherein the first dopant is nitrogen.

19. The method as claimed in claim 14, further forming a second barrier layer between the etching stop layer and the dielectric layer, wherein the second barrier layer blocks a second dopant in the etching stop layer from diffusing into the dielectric layer.

20. The method as claimed in claim 19, wherein the second barrier layer is a silicon-rich oxide layer.

21. The method as claimed in claim 19, wherein the second barrier layer a hydrocarbon-containing silicon-rich oxide layer.

22. The method as claimed in claim 19, wherein the second barrier layer has a thickness of 50 to 1000 A.

23. The method as claimed in claim 19, wherein the second dopant is nitrogen.

24. The method as claimed in claim 14, wherein the stop layer is a silicon-rich oxide layer.

25. The method as claimed in claim 14, wherein the stop layer is a hydrocarbon-containing silicon-rich oxide layer.

26. The method as claimed in claim 14, wherein the protective plug is i-line photoresist.

27. The method as claimed in claim 14, further forming a third barrier layer on the anti-reflective layer.

28. The method as claimed in claim 27, wherein the third barrier layer is a silicon-rich oxide layer.

29. The method as claimed in claim 27, wherein the third barrier layer is a hydrocarbon-containing silicon-rich oxide layer.

30. The method as claimed in claim 27, wherein the third barrier layer has a thickness of 50 to 1000 A.

31. A method of preventing formation photoresist scum for dual damascene process, comprising the steps of:

providing a substrate on which an etching stop layer, a first barrier layer, a dielectric layer, a second barrier layer, an anti-reflective layer, and a third barrier layer are formed;

etching the third barrier layer, the anti-reflective layer, the second barrier layer, the dielectric layer, and the first barrier layer to form a via hole;

forming a protective plug in the via hole;

forming a photoresist pattern layer over the anti-reflective layer, wherein the second barrier layer and the third barrier layers block a first dopant in the anti-reflective layer from diffusing into the dielectric layer and the first barrier layer blocks a second dopant in the etching stop layer from diffusing into the same, in order to prevent forming photoresist scum in the via hole; and etching the third barrier layer, the anti-reflective layer, the second barrier layer and the dielectric layer using the photoresist pattern layer and the protective plug as a mask to form a trench above the via hole, thus forming a dual damascene structure.

32. The method as claimed in claim 31, wherein the first barrier layer is a silicon-rich oxide layer.

33. The method as claimed in claim 31, wherein the first barrier layer is a hydrocarbon-containing silicon-rich oxide layer.

34. The method as claimed in claim 31, wherein the first barrier layer has a thickness of 50 to 1000 A.

35. The method as claimed in claim 31, wherein the second barrier layer is a silicon-rich oxide layer.

36. The method as claimed in claim 31, wherein the second barrier layer is a hydrocarbon-containing silicon-rich oxide layer.

37. The method as claimed in claim 31, wherein the second barrier layer has a thickness of 50 to 1000 A.

38. The method as claimed in claim 31, wherein the third barrier layer is a silicon-rich oxide layer.

39. The method as claimed in claim 31, wherein the third barrier layer is a hydrocarbon-containing silicon-rich oxide layer.

40. The method as claimed in claim 31, wherein the third barrier layer has a thickness of 50 to 1000 A.

41. The method as claimed in claim 31, wherein the first dopant is nitrogen.

42. The method as claimed in claim 31, wherein the second dopant is nitrogen.

43. The method as claimed in claim 31, wherein the protective plug is i-line photoresist.

* * * * *